(12) United States Patent
Saito

(10) Patent No.: US 7,709,395 B2
(45) Date of Patent: May 4, 2010

(54) SEMICONDUCTOR DEVICE FABRICATION METHOD

(75) Inventor: Tomohiro Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 719 days.

(21) Appl. No.: 11/411,800

(22) Filed: Apr. 27, 2006

(65) Prior Publication Data

US 2006/0246685 A1    Nov. 2, 2006

(30) Foreign Application Priority Data

Apr. 28, 2005    (JP) .............................. 2005-132093

(51) Int. Cl.
    *H01L 21/302*    (2006.01)
(52) U.S. Cl. .................. 438/717; 438/942; 257/347
(58) Field of Classification Search ................. 257/329, 257/347, 308; 438/270, 299, 717, 502, 942, 438/946, 947, 950
    See application file for complete search history.

(56) References Cited

U.S. PATENT DOCUMENTS

| 6,391,782 B1 * | 5/2002 | Yu | ............................. 438/696 |
| 6,583,469 B1 | 6/2003 | Fried et al. | |
| 6,706,571 B1 * | 3/2004 | Yu et al. | ...................... 438/157 |
| 6,872,647 B1 * | 3/2005 | Yu et al. | ...................... 438/585 |
| 2005/0074972 A1 | 4/2005 | Saito | |

FOREIGN PATENT DOCUMENTS

| JP | 2002-110963 | 4/2002 |
| JP | 2002-280388 | 9/2002 |
| JP | 2002-359352 | 12/2002 |

\* cited by examiner

*Primary Examiner*—Brook Kebede
*Assistant Examiner*—Mark A Laurenzi, III
(74) *Attorney, Agent, or Firm*—Finnegan, Henderson, Farabow, Garrett & Dunner, L.L.P.

(57) ABSTRACT

According to an aspect of the invention, there is provided a semiconductor device fabrication method including forming a first mask on a semiconductor substrate, processing the first mask to form a first mask pattern of a fine portion, forming a second mask on the semiconductor substrate on which the first mask pattern is formed, forming a second mask pattern on a predetermined portion of the second mask, forming a third mask pattern by anisotropically etching the second mask by using the second mask pattern, removing the second mask pattern and the first mask pattern, and processing the semiconductor substrate by using the third mask pattern.

10 Claims, 8 Drawing Sheets

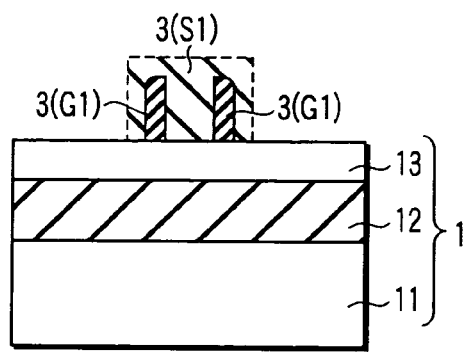
F I G. 15
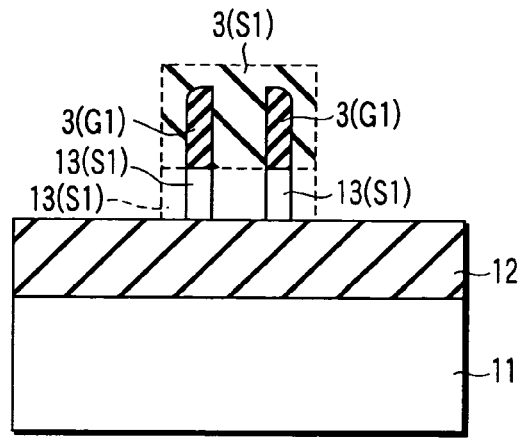
F I G. 17
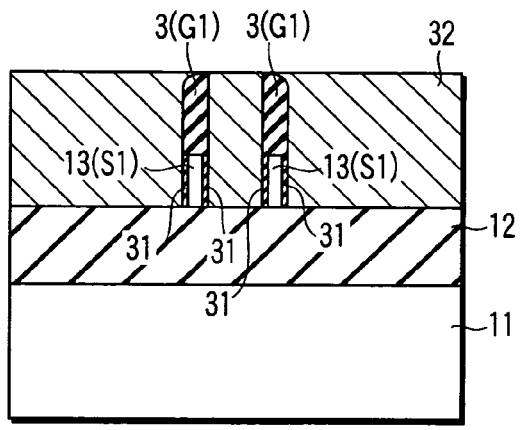
F I G. 18
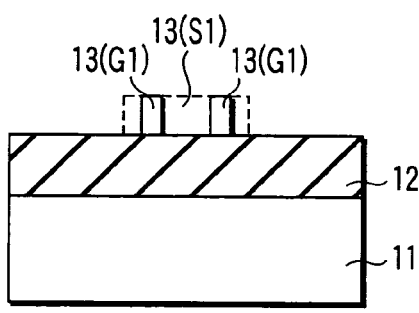
F I G. 16
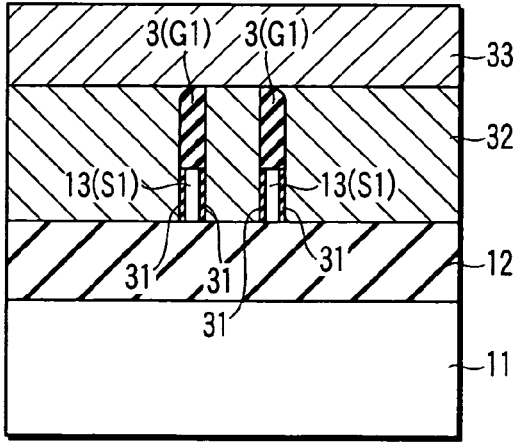
F I G. 19

SEMICONDUCTOR DEVICE FABRICATION METHOD

CROSS-REFERENCE TO RELATED APPLICATIONS

This application is based upon and claims the benefit of priority from prior Japanese Patent Application No. 2005-132093, filed Apr. 28, 2005, the entire contents of which are incorporated herein by reference.

BACKGROUND OF THE INVENTION

1. Field of the Invention

The present invention relates to a semiconductor device fabrication method.

2. Description of the Related Art

As the micropatterning of transistors on silicon semiconductor substrates advances, fin transistors are beginning to be studied instead of the conventional planar transistors. Note that a fin transistor is described in Jpn. Pat. Appln. KOKAI Publication No. 2002-110963. Since fin portions are very fine, however, their patterns cannot be transferred by the conventional resist patterning. Therefore, a method called pattern transfer is used. This pattern transfer roughly comprises the following processes.

First, a silicon nitride film is formed as a primary mask on a buffer film formed on a silicon substrate. This primary mask is then processed by pattern transfer and anisotropic etching using a resist. A silicon oxide film having a thickness x is formed as a secondary mask on the entire surface, and processed by anisotropic etching. In this process, the pattern of the secondary mask having a very small width x is formed around the primary mask. When the primary mask is removed after that, the pattern of the secondary mask having the very small width x is formed on the silicon substrate. Therefore, a silicon pattern having the very small width x can be formed by etching the buffer film and silicon substrate by using this secondary mask.

In this method, however, not only gate portions requiring fine patterns but also pad portions (extended portions of a source and drain) for connecting interconnections are also given fine patterns. Since no sufficient contact area can be obtained, the contact resistance rises.

Note that Jpn. Pat. Appln. KOKAI Publication No. 2002-280388 discloses a technique by which L & S patterns made of a first insulating film are covered with a second insulating film, side walls of the second insulating film are formed on the side surfaces of a first pattern by etch back, and fine L & S patterns are obtained by using the side walls.

Jpn. Pat. Appln. KOKAI Publication No. 2002-359352 discloses a technique by which a first mask pattern is formed on a substrate, a second mask pattern having holes in predetermined portions of the first mask pattern is formed, and very fine patterns are formed by thinning the first pattern in these holes.

U.S. Pat. No. 6,583,469 discloses a method of forming mask patterns for obtaining a structure which connects a narrow channel portion and wide source/drain portions of a fin FET by a moderate tapered shape.

BRIEF SUMMARY OF THE INVENTION

According to an aspect of the invention, there is provided a semiconductor device fabrication method comprising: forming a first mask on a semiconductor substrate; processing the first mask to form a first mask pattern of a fine portion; forming a second mask on the semiconductor substrate on which the first mask pattern is formed; forming a second mask pattern on a predetermined portion of the second mask; forming a third mask pattern by anisotropically etching the second mask by using the second mask pattern; removing the second mask pattern and the first mask pattern; and processing the semiconductor substrate by using the third mask pattern.

According to another aspect of the invention, there is provided a semiconductor device fabrication method comprising: forming a first mask on a semiconductor substrate; processing the first mask and the semiconductor substrate to form a projection serving as a fine portion; burying a dummy interlayer film on the semiconductor substrate on which the projection is formed; forming a dummy interlayer film pattern by removing the first mask; forming a second mask on the semiconductor substrate on which the dummy interlayer film pattern is formed; forming a first mask pattern on a predetermined portion of the second mask; forming a second mask pattern by anisotropically etching the second mask by using the first mask pattern; removing the first mask pattern; and processing the semiconductor substrate by using the second mask pattern.

BRIEF DESCRIPTION OF THE SEVERAL VIEWS OF THE DRAWING

FIG. 15 is a sectional view corresponding to FIG. 7 taken along the line A-A showing the fabrication steps of the semiconductor device according to the first embodiment.

FIG. 16 is a sectional view corresponding to FIG. 8 taken along the line A-A showing the fabrication steps of the semiconductor device according to the first embodiment.

FIG. 17 is a sectional view schematically showing the fabrication steps of a semiconductor device according to a modification example of the first embodiment.

FIG. 18 is a sectional view schematically showing the fabrication steps of the semiconductor device according to the modification example of the first embodiment.

FIG. 19 is a sectional view schematically showing the fabrication steps of the semiconductor device according to the modification example of the first embodiment.

DETAILED DESCRIPTION OF THE INVENTION

Embodiments of the present invention will be described below with reference to the accompanying drawing.

FIGS. 1 to 8 are plan views schematically showing the fabrication steps of a semiconductor device according to the first embodiment. FIGS. 9 to 16 are sectional views corresponding to FIGS. 1 to 8 taken along the line(s) A-A, respectively.

Figure 1:
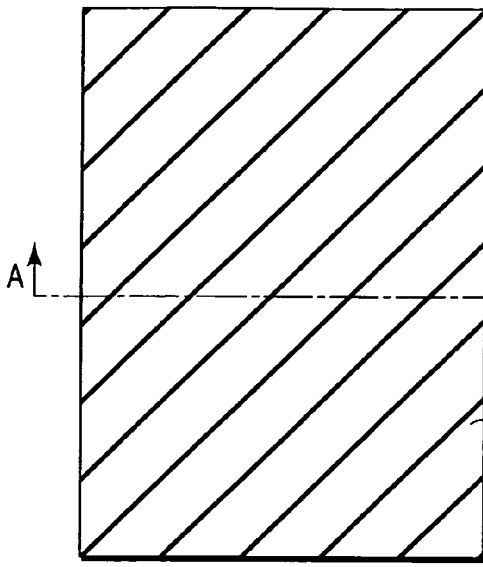
FIG. 1 is a plan view schematically showing the fabrication steps of a semiconductor device according to the first embodiment.
Figure 2:
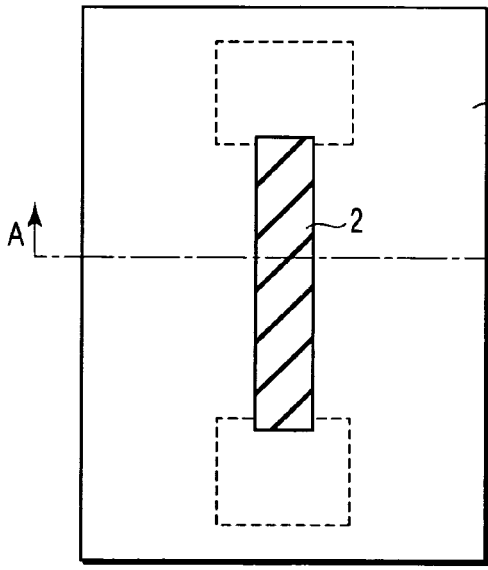
FIG. 2 is a plan view schematically showing the fabrication steps of the semiconductor device according to the first embodiment.
Figure 9:
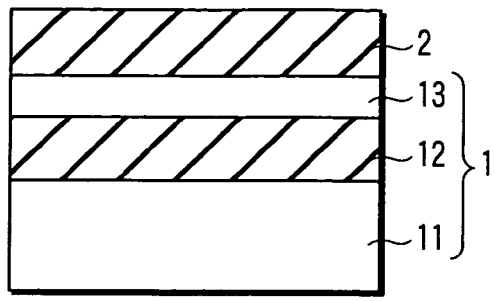
FIG. 9 is a sectional view corresponding to FIG. 1 taken along the line A-A showing the fabrication steps of the semiconductor device according to the first embodiment.
Figure 10:
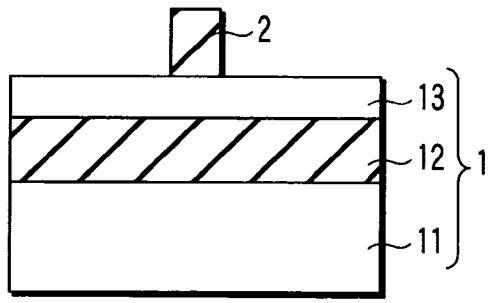
FIG. 10 is a sectional view corresponding to FIG. 2 taken along the line A-A showing the fabrication steps of the semiconductor device according to the first embodiment.

First, as shown in FIGS. 1 and 9, a silicon oxide film is deposited as a primary mask 2 on an SOI substrate (semiconductor substrate) 1 made up of a silicon (Si) substrate 11, BOX (buried oxide film) 12, and SOI (silicon active film) 13. Then, as shown in FIGS. 2 and 10, the primary mask 2 is processed by anisotropic etching using a resist mask, thereby forming a pattern in a portion where gate portions are to be formed.

Figure 3:
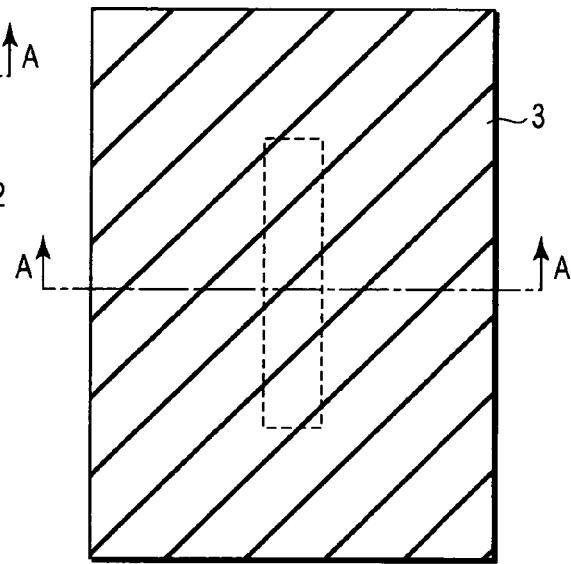
FIG. 3 is a plan view schematically showing the fabrication steps of the semiconductor device according to the first embodiment.
Figure 4:
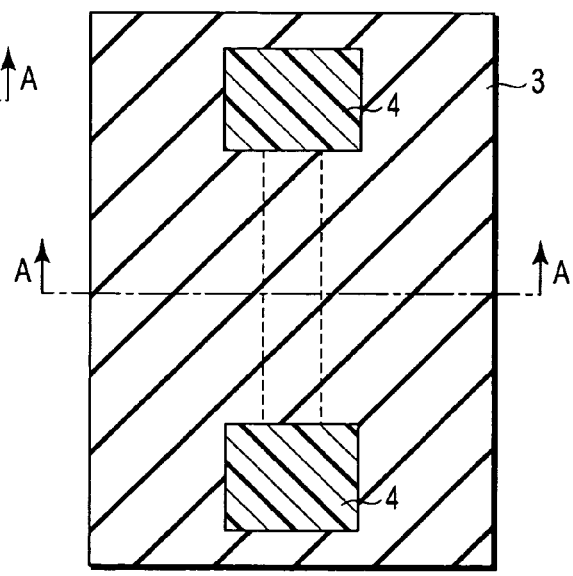
FIG. 4 is a plan view schematically showing the fabrication steps of the semiconductor device according to the first embodiment.
Figure 5:
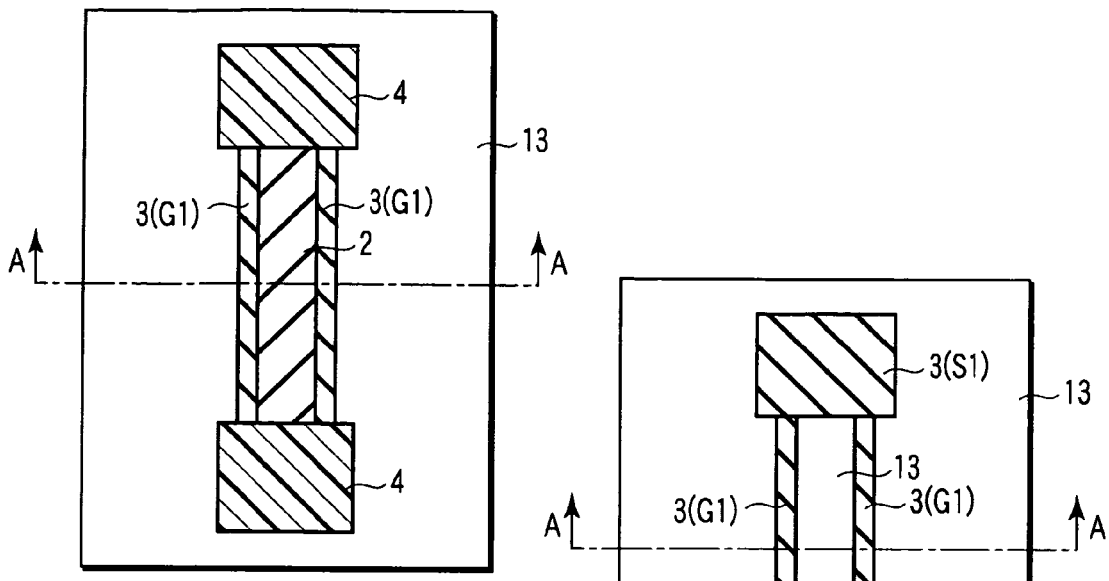
FIG. 5 is a plan view schematically showing the fabrication steps of the semiconductor device according to the first embodiment.
Figure 11:
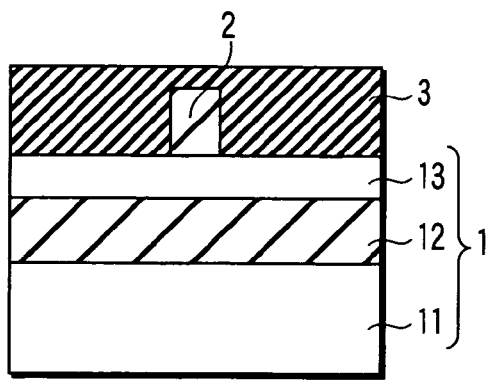
FIG. 11 is a sectional view corresponding to FIG. 3 taken along the line A-A showing the fabrication steps of the semiconductor device according to the first embodiment.
Figure 12:
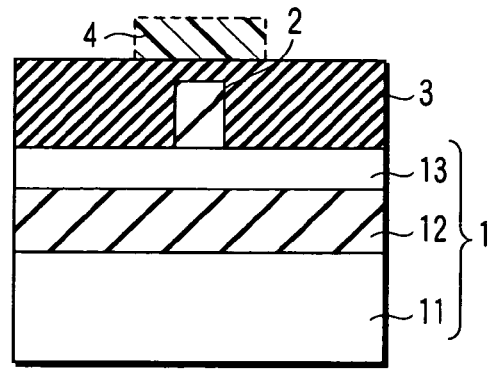
FIG. 12 is a sectional view corresponding to FIG. 4 taken along the line A-A showing the fabrication steps of the semiconductor device according to the first embodiment.
Figure 13:
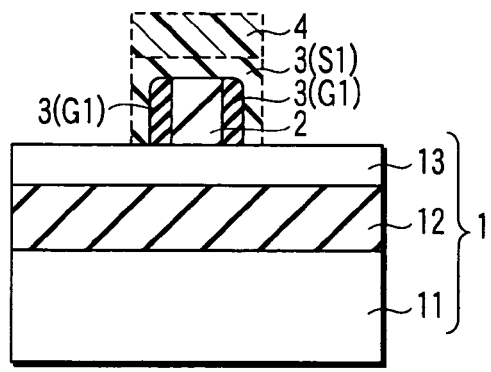
FIG. 13 is a sectional view corresponding to FIG. 5 taken along the line A-A showing the fabrication steps of the semiconductor device according to the first embodiment.

As shown in FIGS. 3 and 11, a silicon nitride film is deposited as a secondary mask 3 on the entire surface. As shown in FIGS. 4 and 12, the patterns of source/drain portions (pad portions and contact portions) except for gate portions to be formed by pattern transfer are covered with resist masks 4. As shown in FIGS. 5 and 13, the silicon nitride film as the secondary mask 3 is processed by anisotropic etching using the resist masks 4. Consequently, gate portions G1 are formed by the silicon nitride film as the secondary mask 3 on only the side surfaces (side walls) (not covered with the resist masks 4) of the silicon oxide film as the primary mask 2, and source/drain portions S1 are formed into the shape of the resist masks 4.

Figure 6:
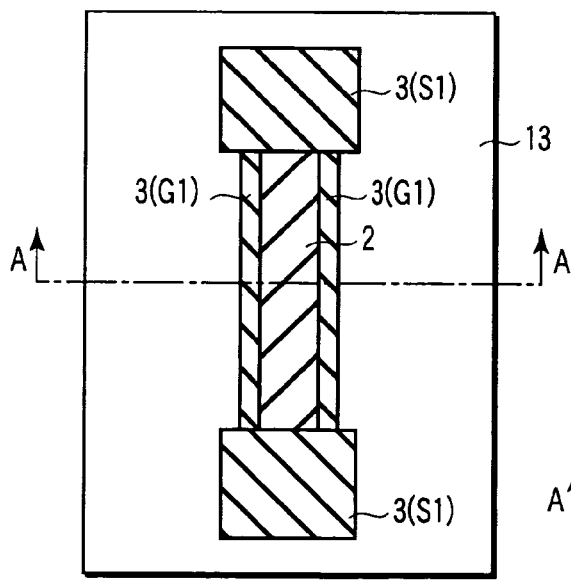
FIG. 6 is a plan view schematically showing the fabrication steps of the semiconductor device according to the first embodiment.
Figure 7:
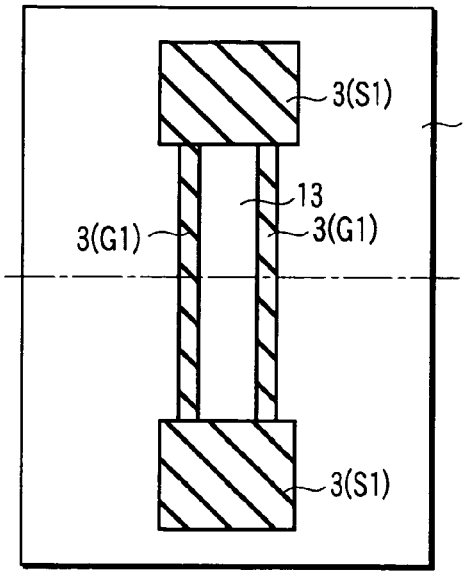
FIG. 7 is a plan view schematically showing the fabrication steps of the semiconductor device according to the first embodiment.
Figure 14:
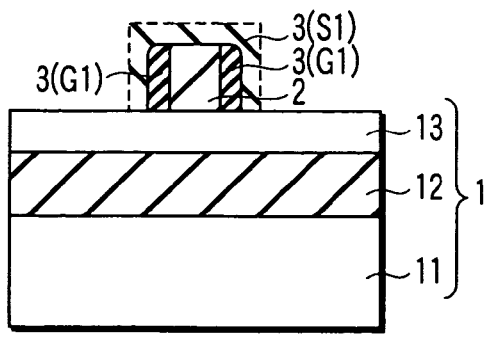
FIG. 14 is a sectional view corresponding to FIG. 6 taken along the line A-A showing the fabrication steps of the semiconductor device according to the first embodiment.

Then, the resist masks 4 are removed as shown in FIGS. 6 and 14. Subsequently, as shown in FIGS. 7 and 15, the silicon oxide film as the primary mask 2 is removed by a dilute hydrofluoric acid treatment, thereby forming the pattern of an active area (AA) in which only the gate portions G1 are formed by pattern transfer.

The SOI 13 of the SOI substrate 1 is then etched by using the secondary mask 3 to process the active area of the fine fin portions (gate portions) and wide source/drain portions. Finally, as shown in FIGS. 8 and 16, the silicon nitride film as the secondary mask 3 is removed by a hot phosphoric acid treatment, thereby forming an active area of the SOI 13 having the fine gate portions G1 and wide source/drain portions S1 formed on the BOX 12.

After that, the transistor is completed by forming gate insulating films, gate electrodes, source/drain diffusion layers, silicides, contacts, and interconnections in the same manner as in the conventional fin transistor formation method.

Figure 8:
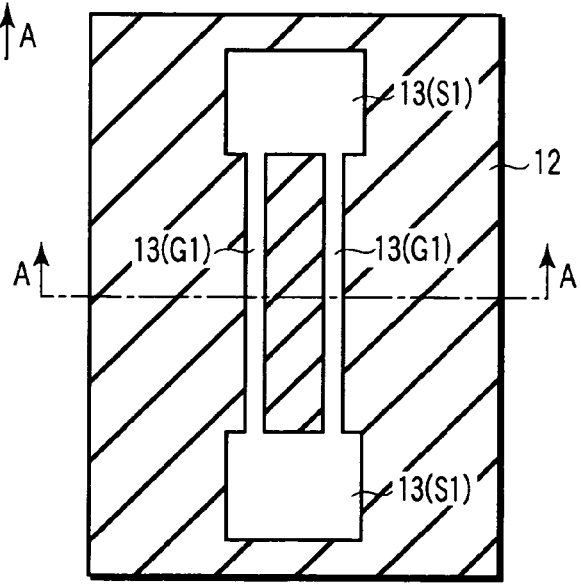
FIG. 8 is a plan view schematically showing the fabrication steps of the semiconductor device according to the first embodiment.

In the first embodiment, as shown in FIGS. 8 and 16, the silicon nitride film as the secondary mask 3 is removed. On the other hand, the silicon nitride film is allowed not to be removed and can be used as a CMP mask in subsequent steps.

FIGS. 17 to 19 are sectional views showing the fabrication steps following the steps shown in FIG. 15, and show steps in the case that the silicon nitride film as the secondary mask 3 is left without being removed. First, in the state that the secondary mask 3 is left as shown in FIG. 17, the exposed silicon substrate is oxidized, or an insulating film is deposited on the entire surface. Thereafter, as shown in FIG. 18, a film quality improvement process using nitriding or annealing is performed, thereby forming a gate insulating film 31. A polysilicon film 32 as a gate electrode is deposited on the entire surface, and the upper surface is planarized by CMP or the like in order to improve patterning accuracy. When the film thickness of a gate electrode portion in the upper fin portion is small, as shown in FIG. 19, a polysilicon film 33 is further deposited to improve the resultant structure.

Thereafter, resist patterning and RIE allow patterning of the polysilicon films 32 and 33 to form the gate electrode. Impurity ion implantation and short-time annealing allow formation of extension portions of the source and drain regions. For example, a silicon nitride film is deposited as prospective side walls, and the entire surface of the silicon nitride film is etched back to form side walls. Impurity ion implantation and annealing are performed again to form source and drain diffusion layers.

A silicide layer can be formed to reduce the electric resistances of the gate and source and drain portions. That is, the exposed silicon portion is cleaned in a pre-process, and, for example, nickel is formed on the entire surface of the silicon portion. The resultant structure is annealed at about 500° C. to react silicon with nickel, thereby forming a nickel silicide layer.

A contact can be formed as follows. An interlayer dielectric film mainly including a silicon oxide film is deposited. Resist patterning and RIE allow formation of a contact hole. A barrier metal such as Ti or TiN and W serving as a material to be buried are buried in the contact hole, and a W portion left on the upper surface is removed, thereby forming a contact (plug). An interconnection is formed by depositing a metal mainly containing aluminum and patterning it by RIE.

A multilayered interconnection can be formed by repeating formation of an interlayer dielectric film and formation of a contact and interconnection. A lower-resistant interconnection can be formed by using a buried copper interconnection. A transistor is thus formed.

FIGS. 20 to 28 are plan views schematically showing the fabrication steps of a semiconductor device according to the second embodiment. FIGS. 29 to 37 are sectional views corresponding to FIGS. 20 to 28 taken along the lines A-A, respectively. In the second embodiment, a damascene gate process is used to form an active area in which the distance between fin portions is shorter than that in the first embodiment.

Figure 20:
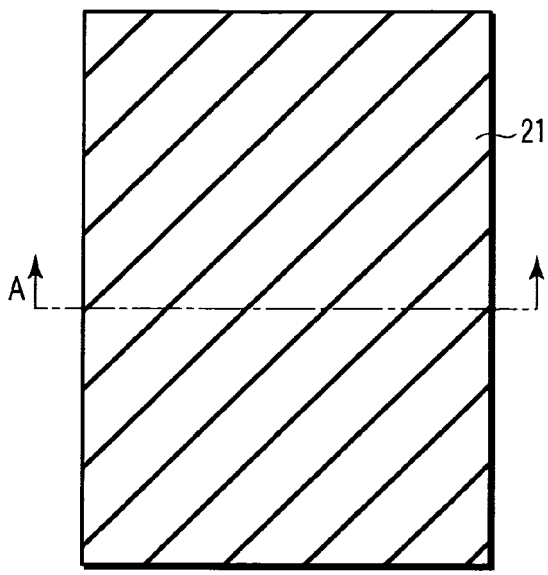
FIG. 20 is a plan view schematically showing the fabrication steps of a semiconductor device according to the second embodiment.
Figure 22:
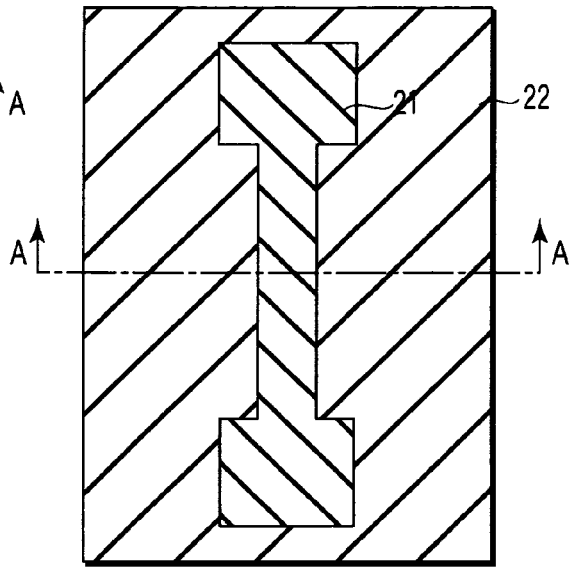
FIG. 22 is a plan view schematically showing the fabrication steps of the semiconductor device according to the second embodiment.
Figure 21:
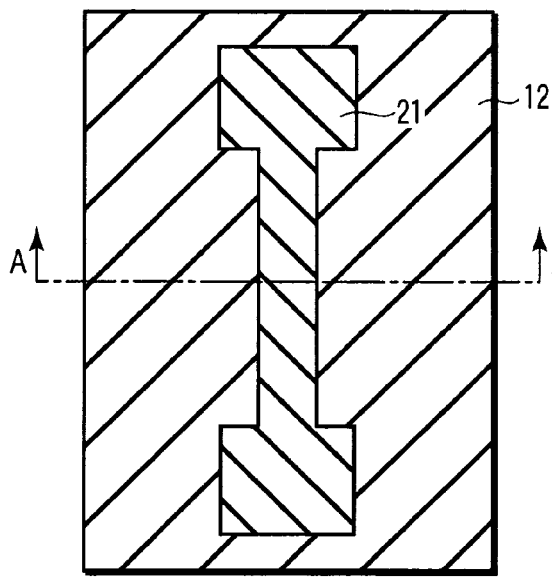
FIG. 21 is a plan view schematically showing the fabrication steps of the semiconductor device according to the second embodiment.
Figure 30:
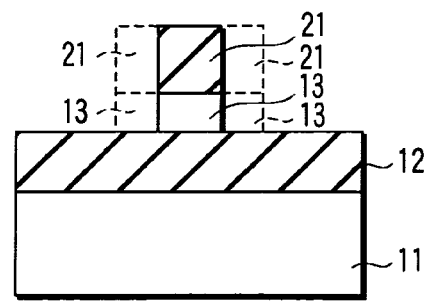
FIG. 30 is a sectional view corresponding to FIG. 21 taken along the line A-A showing the fabrication steps of the semiconductor device according to the second embodiment.
Figure 31:
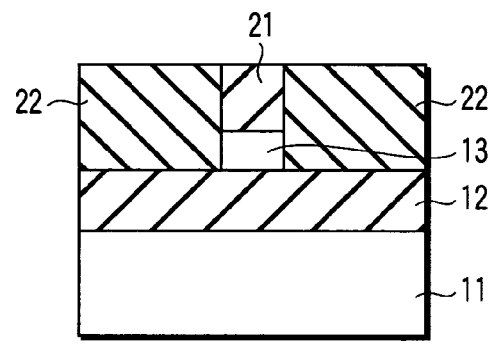
FIG. 31 is a sectional view corresponding to FIG. 22 taken along the line A-A showing the fabrication steps of the semiconductor device according to the second embodiment.
Figure 29:
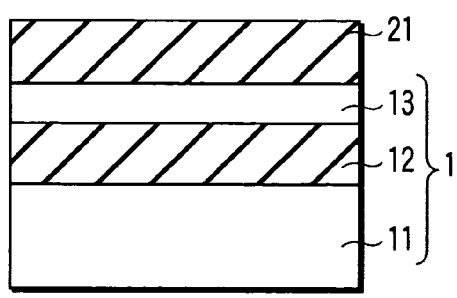
FIG. 29 is a sectional view corresponding to FIG. 20 taken along the line A-A showing the fabrication steps of the semiconductor device according to the second embodiment.

First, as shown in FIGS. 20 and 29, a silicon nitride film is deposited as a primary mask 21 on a buffer oxide film (not shown) formed on an SOI substrate 1 made up of a silicon substrate 11, BOX 12, and SOI 13. Then, as shown in FIGS. 21 and 30, the primary mask 21, buffer oxide film, and SOI 13 are processed by anisotropic etching using a resist mask, thereby forming a projection serving as gate portions. As shown in FIGS. 22 and 31, a silicon oxide film 22 (dummy interlayer film) is deposited on the entire surface and planarized by CMP or the like (the dummy interlayer film is buried), thereby exposing the upper surface of the silicon nitride film as the primary mask 21.

Figure 23:
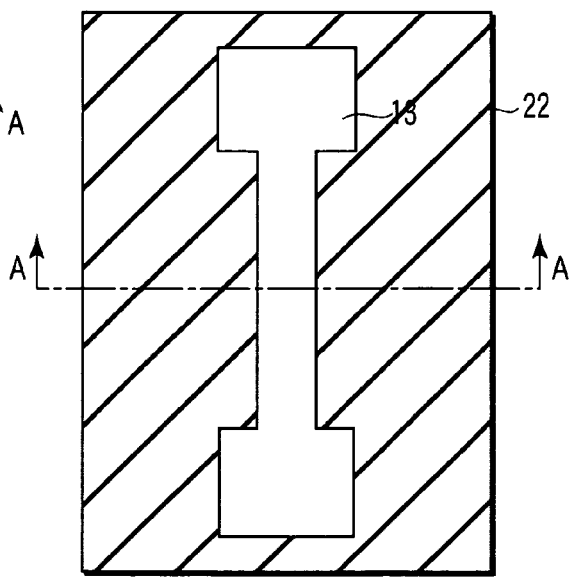
FIG. 23 is a plan view schematically showing the fabrication steps of the semiconductor device according to the second embodiment.
Figure 24:
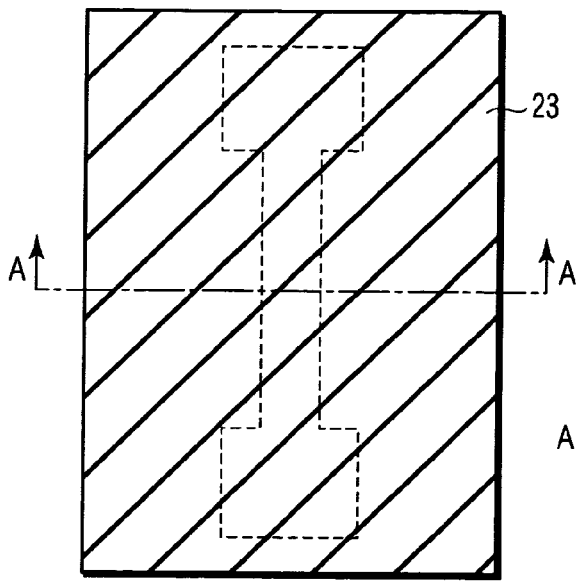
FIG. 24 is a plan view schematically showing the fabrication steps of the semiconductor device according to the second embodiment.
Figure 25:
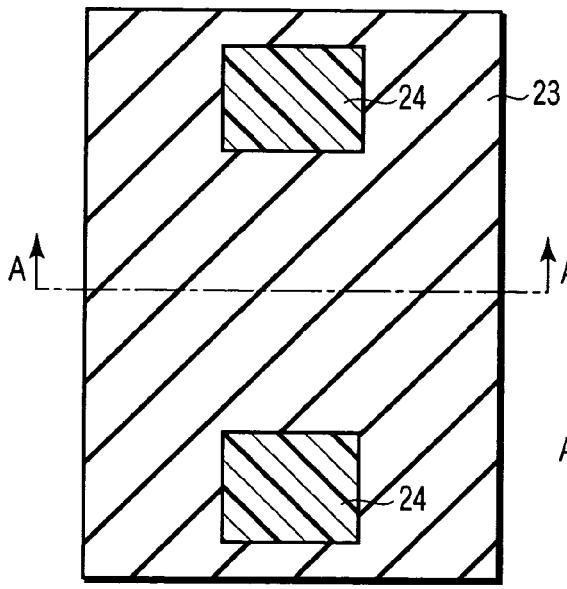
FIG. 25 is a plan view schematically showing the fabrication steps of the semiconductor device according to the second embodiment.
Figure 32:
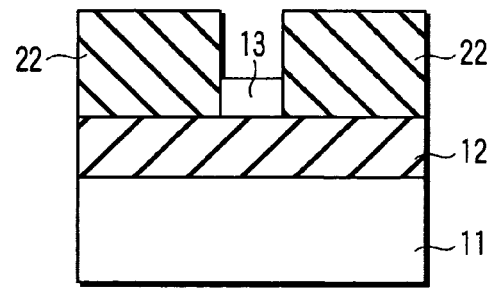
FIG. 32 is a sectional view corresponding to FIG. 23 taken along the line A-A showing the fabrication steps of the semiconductor device according to the second embodiment.
Figure 33:
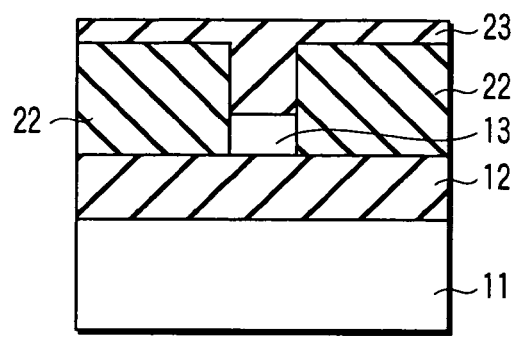
FIG. 33 is a sectional view corresponding to FIG. 24 taken along the line A-A showing the fabrication steps of the semiconductor device according to the second embodiment.
Figure 34:
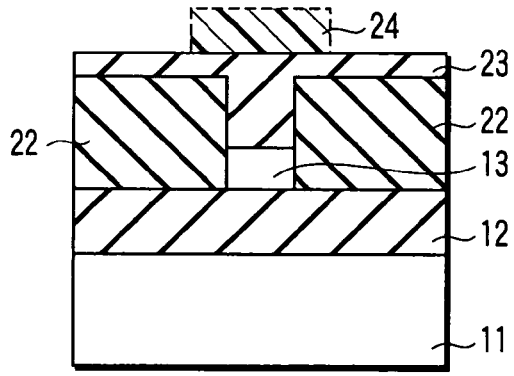
FIG. 34 is a sectional view corresponding to FIG. 25 taken along the line A-A showing the fabrication steps of the semiconductor device according to the second embodiment.

Subsequently, as shown in FIGS. 23 and 32, the pattern of the silicon oxide film 22 is formed by removing the silicon nitride film as the primary mask 21. As shown in FIGS. 24 and 33, a silicon nitride film is deposited as a secondary mask 23 on the entire surface. As shown in FIGS. 25 and 34, source/drain portions (pad portions and contact portions) except for a portion wherein fine fin bodies are to be formed are covered with resist masks 24.

Figure 26:
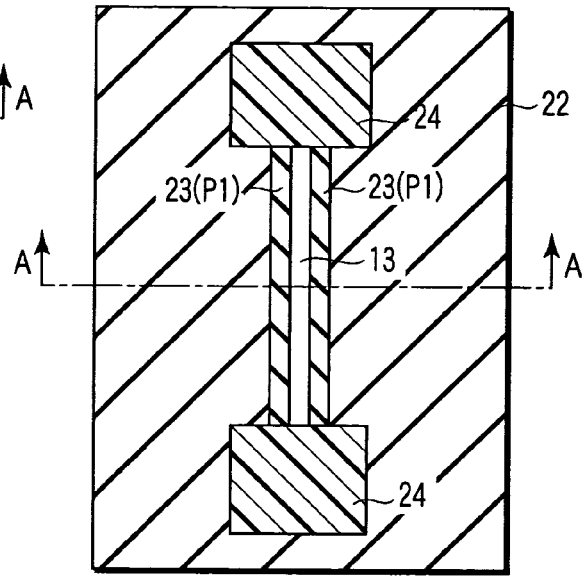
FIG. 26 is a plan view schematically showing the fabrication steps of the semiconductor device according to the second embodiment.
Figure 27:
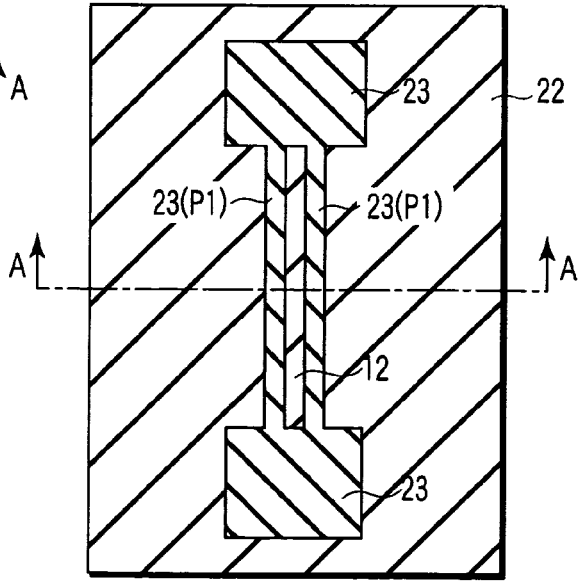
FIG. 27 is a plan view schematically showing the fabrication steps of the semiconductor device according to the second embodiment.
Figure 35:
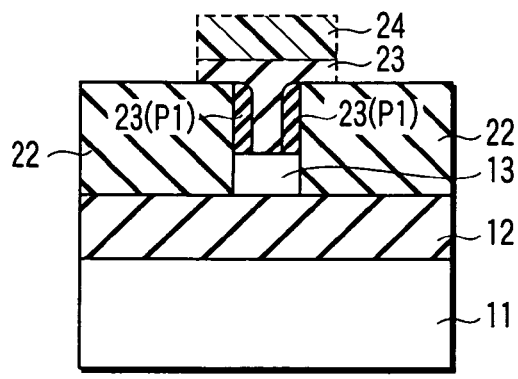
FIG. 35 is a sectional view corresponding to FIG. 26 taken along the line A-A showing the fabrication steps of the semiconductor device according to the second embodiment.
Figure 36:
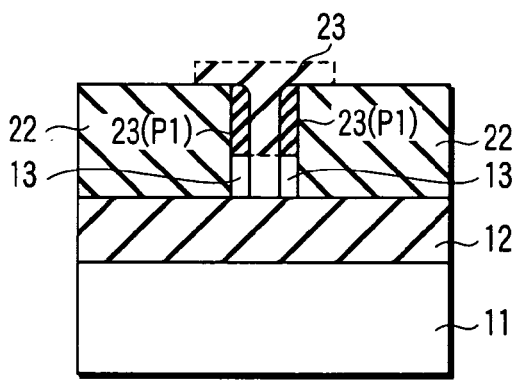
FIG. 36 is a sectional view corresponding to FIG. 27 taken along the line A-A showing the fabrication steps of the semiconductor device according to the second embodiment.

As shown in FIGS. 26 and 35, the silicon nitride film as the secondary mask 23 is processed by anisotropic etching using the resist masks 24, thereby forming fine silicon nitride film patterns P1 along the inner wall portions (not covered with the resist masks 24) of the silicon oxide film 22. Since the portions covered with the resist masks 24 are not etched, no fine patterns are formed on these portions along the silicon oxide film 22. As shown in FIGS. 27 and 36, the resist mask 24 is removed, and the SOI 13 is processed by anisotropic etching using the silicon nitride film as the secondary mask 23, thereby forming an active area of fine fin portions (gate portions) and wide source/drain portions.

Figure 28:
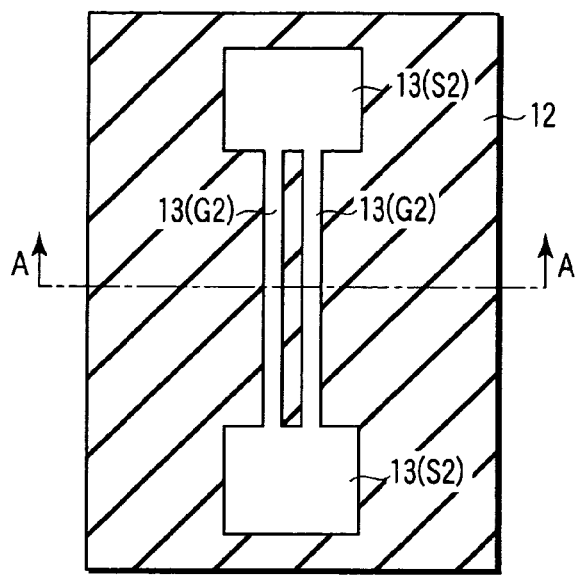
FIG. 28 is a plan view schematically showing the fabrication steps of the semiconductor device according to the second embodiment.
Figure 37:
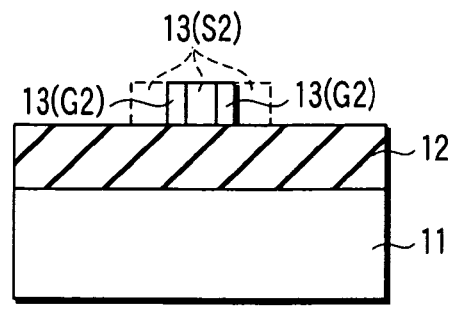
FIG. 37 is a sectional view corresponding to FIG. 28 taken along the line A-A showing the fabrication steps of the semiconductor device according to the second embodiment.

Finally, as shown in FIGS. 28 and 37, the silicon nitride film as the secondary mask 23 is removed by a hot phosphoric acid treatment, and the silicon oxide film 22 is etched to a predetermined depth (to the BOX 12 in FIG. 37), thereby forming an active area of the SOI 13 having fine gate portions G2 and wide source/drain portions S2 formed on the BOX 12.

After that, the transistor is completed by forming gate insulating films, gate electrodes, source/drain diffusion layers, silicides, contacts, and interconnections in the same manner as in the conventional fin transistor formation method.

In this embodiment as described above, a semiconductor device including a transistor having wide source/drain portions and gate portions made of fine fin bodies can be formed. In a so-called fin body MOS-FET, a pattern transfer process is used to form fine patterns. This process has the problem that although gate portions are given necessary fine patterns, source/drain portions and the like requiring wide contact areas are also given fine patterns. This embodiment avoids this problem, and can form fine patterns in only necessary portions.

Note that the present invention is not limited to the above embodiments, and can be appropriately modified without departing from the spirit and scope of the invention when practiced. For example, a transistor using an ordinary silicon substrate may also be formed as well as a transistor using an SOI substrate. Also, the fine pattern formation method according to each embodiment is applicable to a gate pattern as well as an active area. In this case, the method can be used to process, e.g., polysilicon of the gate electrode. A plurality of fine patterns may also be formed by repeating the process of each embodiment. In addition, each mask may also be made of a plurality of layers instead of a single layer.

Each of the above embodiments can provide a semiconductor device fabrication method capable of forming a fine pattern in only a necessary portion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device fabrication method comprising:
   forming a first mask on a semiconductor substrate;
   processing the first mask to form a first mask pattern of a fine portion;
   forming a second mask on the semiconductor substrate on which the first mask pattern is formed;
   forming a second mask pattern on the second mask, the second mask pattern sandwiching a region above a predetermined portion of the first mask pattern;
   forming a third mask pattern by anisotropically etching the second mask by using the second mask pattern, the third mask pattern being formed on sidewalls of the predetermined portion of the first mask pattern and under the second mask pattern;

removing the second mask pattern and the first mask pattern; and processing the semiconductor substrate by using the third mask pattern.

2. The method according to claim 1, wherein the first mask comprises a silicon oxide film, and the second mask comprises a silicon nitride film.

3. The method according to claim 1, wherein the semiconductor substrate contains silicon.

4. The method according to claim 1, wherein the semiconductor substrate comprises an SOI substrate.

5. The method according to claim 4, wherein a silicon active film of the SOI substrate is processed by using the second mask.

6. A semiconductor device fabrication method comprising:

forming a first mask on a semiconductor substrate;

processing the first mask and the semiconductor substrate to form a projection serving as a fine portion;

burying a dummy interlayer film on the semiconductor substrate on which the projection is formed;

forming a trench in the dummy interlayer film by removing the first mask included in the projection;

forming a second mask on the dummy interlayer film and in the trench;

forming a first mask pattern on the second mask, the first mask pattern sandwiching a region above a predetermined portion of the trench;

forming a second mask pattern by anisotropically etching the second mask by using the first mask pattern, the second mask pattern being formed on inner sidewalls of the predetermined portion of the trench and under the first mask pattern;

removing the first mask pattern; and processing the semiconductor substrate by using the second mask pattern.

7. The method according to claim 6, wherein each of the first mask and the second mask comprises a silicon nitride film.

8. The method according to claim 6, wherein the semiconductor substrate contains silicon.

9. The method according to claim 6, wherein the semiconductor substrate comprises an SOI substrate.

10. The method according to claim 9, wherein a silicon active film of the SOI substrate is processed by using the second mask.

* * * * *